United States Patent

[11] 3,562,604

[72] Inventors Karel Jakobus Block Van Laer;
Frans Victor Willem Ten Bloemendal,
Mollenhutseweg, Nijmegen, Netherlands

[21] Appl. No. 727,487
[22] Filed May 8, 1968
[45] Patented Feb. 9, 1971
[73] Assignee U. S. Philips Corporation
New York, N.Y.
a corporation of Delaware. by mesne assignments
[32] Priority May 18, 1967
[33] Netherlands
[31] 6706868

[54] SEMICONDUCTOR DEVICE PROVIDED WITH AN INSULATING LAYER OF SILICON OXIDE SUPPORTING A LAYER OF ALUMINUM
7 Claims, 4 Drawing Figs.

[52] U.S. Cl. 317/234, 317/235; 117/212
[51] Int. Cl. H01l 3/00
[50] Field of Search 317/234/3.1, 234/5.3, 235/46, 235/5.3(Inquired)

[56] References Cited

UNITED STATES PATENTS

| | | | |
|---|---|---|---|
| 3,436,616 | 4/1969 | Jarrod | 317/234 |
| 3,429,029 | 2/1969 | Langdon | 29/589 |
| 3,365,628 | 1/1968 | Luxem | 317/234 |
| 3,408,733 | 11/1968 | Arnold | 29/590 |

*Primary Examiner*—John W. Huckert
*Assistant Examiner*—Martin H. Edlow
*Attorney*—Frank R. Trifari

ABSTRACT: A semiconductor device comprising a semiconductor body containing an insulating layer of silicon oxide and on top of the silicon oxide a layer of aluminum, which may become rough or uneven when the device is subjected to a thermal treatment. To avoid the latter, the aluminum layer is covered with a titanium layer and a second aluminum layer on top of the titanium.

PATENTED FEB 9 1971

3,562,604

Figure 1:
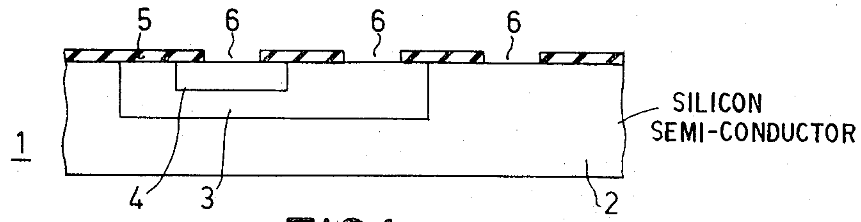

INVENTORS
KAREL J. BLOK VAN LAER
FRANS V.W. TEN BLOEMENDAL
BY
Frank R. Trifari
AGENT

SEMICONDUCTOR DEVICE PROVIDED WITH AN INSULATING LAYER OF SILICON OXIDE SUPPORTING A LAYER OF ALUMINUM

The invention relates to a semiconductor device, for example, a diode, a transistor, a photocell or an integrated crystal circuit, provided with an insulating layer, for example, of silicon oxide supporting a layer of aluminum. Frequently, such a layer of silicon oxide is to include both the monoxide (SiO) and the dioxide ($SiO_2$), is used to protect the surface of a semiconductor device from external influences or to support conducting layers. The semiconductor device generally consists of silicon, but layers of silicon oxide may also be applied to other semiconductor bodies and even to metal supports.

It is known to apply aluminum layers, more particularly from the vapor phase, to a layer of silicon oxide. The layers thus obtained generally have a smooth and uninterrupted surface.

Under certain conditions, it is desirable, however, to heat a semiconductor device thus manufactured to comparatively high temperatures. This may be the case, for example, with semiconductor devices in which the aluminum is applied not only to the oxide but also to the semiconductor material itself and in which the characteristic properties between the aluminum and the semiconductor material can be influenced by a thermal treatment. For example, in case the semiconductor material consists of silicon, a thermal treatment is often carried out at a temperature lying immediately below the eutectic temperature of silicon and aluminum, i.e. approximately 570° C.

It has been found that such a thermal treatment may result in the formation of unevennesses on the part of the aluminum surface lying on the oxide, which may afterwards give rise to instabilities. These unevennesses may give rise to difficulties especially if an insulating layer for protecting from external influences, for example, a glass layer, is provided on the semiconductor device. In this case, there is a risk of interruptions being formed at the unevennesses.

The invention has for an object inter alia to avoid these disadvantages. According to the invention, the aluminum layer is covered at least in part with a titanium layer and a second aluminum layer. It has been found that the titanium layer between the two aluminum layers prevents the formation of unevennesses and moreover cannot attack the oxide layer, which would be the case if the titanium layer should be applied directly to the oxide.

The titanium layer is preferably thinner than the aluminum layers, more particularly thinner than 0.1 $\mu$. This is based inter alia on the following considerations. In the manufacture of semiconductor devices, the aforesaid aluminum layers have frequently to be partly removed, particularly by etching. A given conducting pattern may thus be obtained. Aluminum is a metal which can be etched without difficulty. Titanium has a considerably higher chemical resistance than aluminum, however, and can be etched away only with great difficulty. It has been found that the formation of the aforesaid unevennesses can be prevented already by an interposed titanium layer which is so thin than not difficulties are involved in etching.

The second aluminum layer is preferably covered by a glass layer.

The invention will now be described more fully, by way of example, with reference to a drawing.

The FIGS. are sectional views of a semiconductor device, more particularly a planar transistor, at different manufacture stages. They are drawn diagrammatically on an enlarged scale, the dimensions of various parts not being enlarged proportionally for the sake of clarity.

The basic device is a transistor consisting of a semiconductor body 1 of monocrystalline n-type silicon, in which a base zone 3 and an emitter zone 4 have been formed by diffusion. The remaining part 2 of the crystal constitutes the collector zone. To the body 1 has also been applied in known manner an insulating layer 5 consisting in this case of silicon oxide. Three windows 6 have been etched in this layer by means of photographic techniques. These windows 6 give access to the zones 2, 3 and 4. Although in this embodiment, the semiconductor crystal comprises only one transistor, in general a large number of transistors at a time will be manufactured from one crystal. (Cf. FIG. 1).

Figure 2:
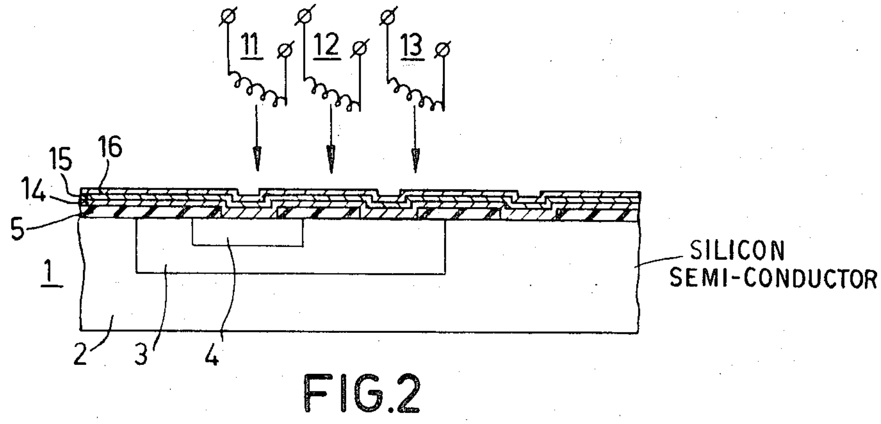

The crystal is then introduced into a space to be exhausted (not shown) which accommodates three tungsten filaments 11, 12 and 13 which are individually connected to a current source (Cf. FIG. 2). A small quantity of aluminum is applied to the first and the last filament, whilst the second filament is provided with a small quantity of titanium. Subsequently, the carefully cleaned semiconductor body is introduced into the space and placed on a support (not shown) which is heated at a temperature of approximately 300°C. The distance of the filaments from the semiconductor body may be, for example 10 cm. Whilst maintaining in the space a vacuum of $5.10^{-6}$ Torr, the filaments are then switched on individually in order of succession, as a result of which first a layer of aluminum 14 having a thickness of 1 $\mu$ is deposited on the semiconductor body in the direction of the arrows, then a layer of titanium 15 of 0.02 $\mu$ thickness and finally again a layer of aluminum 16 of 0.2 $\mu$ thickness. The quantities of aluminum and titanium applied to the filaments 11, 12 and 13 were experimentally determined so that these layer thicknesses were obtained.

Thus, the whole upper surface of the semiconductor body is covered with metal. In a usual manner, a desired pattern can be formed in this metal layer by means of photographic masks and etching. For this purpose, for example, the upper aluminum layer 16 is removed at the unmasked regions in a solution of one-half percent sodium hydroxide (NaOH) in water; this solution does not attack the layer 15, however, The latter layer may be treated in an etching bath consisting of 1 part by volume of hydrofluoride (HF), 5 parts by volume of nitric acid ($HNO_3$) and 140 parts by volume of water. Finally, the lower aluminum layer 14, which was attacked already in the last-mentioned bath, may be removed entirely in a bath consisting of 5 parts by volume of phosphoric acid (H3$PO_4$), one-fifth parts by volume of nitric acid ($HNO_3$), 1 part by volume of acetic acid (CH3COOH) and 1 part by volume of water.

Figure 3:
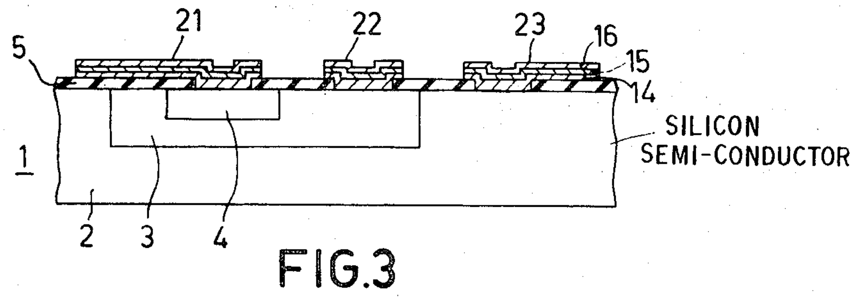

After conductors of a given pattern have thus been obtained, i.e. an emitter contact 21, a base contact 22 and a collector contact 23, and after the residues of the photographic mask have been removed, a thermal treatment at approximately 550° C is carried out for 10 minutes, as a result of which the emitter- and collector-contacts as well as the base contact 22 are in satisfactory ohmic connection with the subjacent silicon (cf. FIG. 3)

Figure 4:
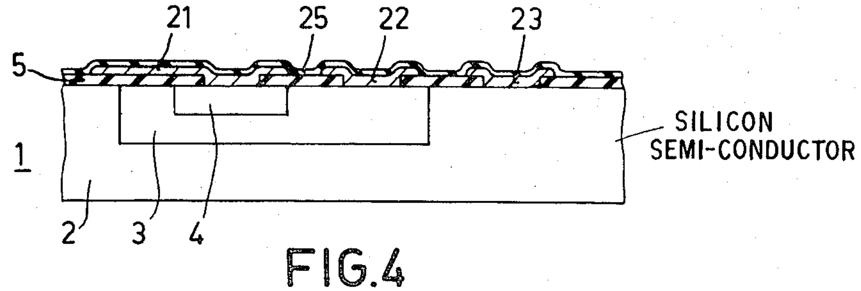

Subsequently, the assembly may be coated with an insulating layer, for example, with a layer of borosilicate glass, which may be obtained by introducing the semiconductor body provided with the contacts 21, 22 and 23 (which for the sake of clarity are shown in FIG. 4 as if they consisted of one layer) into a space heated at 500° C. By means of a carrier gas such as argon, vapor of triethyl borate $(C_2H_5O)3B$ and vapor of tetraethylorthosilicate $(C_2H5O)_4$ Si is introduced into this space, whilst at the same time oxygen is supplied. Thus, a layer 25 consisting of silicon dioxide and boric acid anhydride and having a thickness of one-half $\mu$ is formed on the semiconductor body. This layer may serve to passivate the surface of the semiconductor device and also to provide it afterwards with apertures at the contacts 21, 22 and 23 for receiving connections with these contacts. For the passivating effect of this layer, it is of particular importance that the subjacent metal layers should not exhibit unevennesses or interruptions.

It should be noted that of course the invention is not limited to this embodiment and that there is a possibility of applying besides the two said aluminum layers other metal layers.

The invention is not limited either to a layer consisting of silicon oxide, but is also applicable to other insulating layers on which unevennesses are formed by aluminum layers.

We claim:

1. In a semiconductor device having an insulating layer on a surface portion thereof, and an aluminum layer on said insulating layer, the improvement comprising a titanium layer on at least a portion of said aluminum layer, and a second aluminum layer on said titanium layer.

2. A semiconductor device as claimed in claim 1 wherein the insulating layer comprises silicon oxide.

3. A semiconductor device as claimed in claim 2 wherein the titanium layer is thinner than both of the aluminum layers.

4. A semiconductor device as claimed in claim 3 wherein the titanium layer is thinner than 0.1 $\mu$.

5. A semiconductor device as claimed in claim 1 wherein the second aluminum layer is covered with an insulating layer comprising an oxide or glass.

6. A semiconductor device as set forth in claim 1 wherein the device comprises a silicon body, and the insulating layer comprises silicon oxide on a surface portion of said body.

7. A semiconductor device as set forth in claim 6 wherein the aluminum layer on said insulating layer has a portion which extends through an opening of the insulating layer and forms an ohmic connection to the silicon surface.